United States Patent [19]
Tanner et al.

[11] Patent Number: 5,976,634
[45] Date of Patent: *Nov. 2, 1999

[54] GOLD PLATING PROCESS FOR PLASTIC SUBSTRATES

[75] Inventors: James W. Tanner, Hamilton, Ohio; Todd Dennis, Batesville; Tim Chaffee, Brooksville, both of Ind.

[73] Assignee: Batesville Casket Company, Inc., Batesvile, Ind.

[ * ] Notice: This patent is subject to a terminal disclaimer.

[21] Appl. No.: 08/963,704

[22] Filed: Nov. 4, 1997

Related U.S. Application Data

[63] Continuation-in-part of application No. 08/605,910, Feb. 23, 1996, Pat. No. 5,683,756.

[51] Int. Cl.$^6$ .............................. B05D 1/04; C23C 14/02
[52] U.S. Cl. .................... 427/475; 427/250; 427/404; 427/534; 427/541
[58] Field of Search ...................... 427/475, 250, 427/405, 534, 541, 404

[56] References Cited

U.S. PATENT DOCUMENTS

| | | |
|---|---|---|
| 3,186,864 | 6/1965 | Pettigrew et al. . |
| 3,861,989 | 1/1975 | Ashenfarb et al. . |
| 4,309,460 | 1/1982 | Singh et al. . |
| 4,740,384 | 4/1988 | Meisner et al. . |
| 4,975,305 | 12/1990 | Biginelli . |
| 5,468,518 | 11/1995 | Lein et al. . |
| 5,540,788 | 7/1996 | Defalco et al. . |
| 5,604,965 | 2/1997 | Shaw et al. .................................... 27/2 |
| 5,683,756 | 11/1997 | Tanner et al. ........................... 427/475 |

*Primary Examiner*—Shrive Beck
*Assistant Examiner*—Bret Chen
*Attorney, Agent, or Firm*—Wood, Herron & Evans, L.L.P.

[57] ABSTRACT

A method for plating substrates with 24 K gold. The method includes precleaning the substrate; applying a paint base coat electrostatically; curing the base coat; plating the gold by vacuum metallization; applying a clear paint top coat; and curing the top coat. The method is applicable to metals, including zinc, and plastics, including polycarbonate.

13 Claims, No Drawings

GOLD PLATING PROCESS FOR PLASTIC SUBSTRATES

RELATED APPLICATION

This application is a continuation-in-part of application Ser. No. 08/605,910, filed Feb. 23, 1996, issued as U.S. Pat. No. 5,683,756 on Nov. 4, 1997.

FIELD OF THE INVENTION

The invention relates to a plating process and more particularly to a process for gold plating substrates, including metals such as zinc, and plastics, by vacuum metallization.

BACKGROUND OF THE INVENTION

Metal coating or plating of metal or plastic parts can be accomplished using one of a variety of known techniques, such as electroplating, low temperature arc vapor deposition, sputtering and vacuum metallizing. In the context of decorative parts and hardware used on caskets, the plating process is critical to achieve desired color consistency and adherence of the plated metal onto the part. In the case of plating gold onto metal or plastic parts, color consistency and adherence are particularly critical factors. Heretofore, electroplating generally was the process of choice; however, electroplating has certain drawbacks from an economic standpoint, as well as being less environmentally "friendly" as it requires the disposal of solutions which may contain hazardous or otherwise undesirable contaminants.

What is needed is a process for gold plating metal or plastic parts, including hardware and decorative parts for caskets, that is economical, environmentally friendly and provides consistent color coatings with good adhesion to the substrate, whether it is metal or plastic.

SUMMARY OF THE INVENTION

In its broadest aspects, the present invention is directed to a method of plating a metal or plastic substrate with gold. The method of the invention, which is particularly applicable to plating 24 K gold onto zinc or polycarbonate substrates, includes applying a paint base coat to a precleaned surface of a zinc or polycarbonate substrate and curing the paint base coat. Thereafter the gold is plated onto the paint base coat by vacuum metallization, and a protective paint top coat is applied over the gold plating and cured. The paint top coat is preferably clear/transparent.

The products resulting from the method of the present invention exhibit excellent adhesion of the gold plating to the substrate, which is due at least in part to the base coat, as well as consistent coloring of the gold plating. Another attendant advantage of the method of the present invention is the relative economic savings vis-a-vis known electroplating methods. Furthermore, the method of the invention avoids the environmental drawbacks of electroplating methods in general.

In one specific embodiment of the invention, a zinc substrate is precleaned by first washing the surfaces thereof to be plated with an iron phosphatizer. The surfaces are then rinsed with water and a rinsing agent is applied to enhance removal of grease and lubricants. Subsequently, the zinc substrate is dried and a paint base coat is applied to the precleaned surfaces by an electrostatic application process. The base coat is cured and baked onto the zinc substrate. Thereafter the gold is plated onto the paint base coat by vacuum metallization. As a means of protecting the gold plating and further ensuring its adherence to the substrate, a clear paint top coat is applied over the gold plating by an electrostatic application process. Thereafter the top coat is cured and the part is complete.

In an alternative embodiment of the invention, a polycarbonate substrate is precleaned using deionized water and thereafter a salt solution of approximately 0.5%–2.0% concentration is applied to the surfaces of the part to provide an electrostatic charge to the plastic. As an alternative, it is contemplated that carbon particles could be incorporated in the plastic part during the molding process to provide the requisite electrostatic charge. Thereafter, a paint base coat is applied to the precleaned and electrostatically charged surfaces of the part by an electrostatic application process. The base coat is cured and baked onto the plastic substrate. Thereafter the gold is plated onto the paint base coat by vacuum metallization. As a means of protecting the gold plating and further ensuring its adherence to the substrate, a clear paint top coat is applied over the gold plating by an electrostatic application process. Thereafter the top coat is cured and the part is complete.

These and other features and aspects of the present invention will become more apparent to persons skilled in the art upon reading the detailed description of the invention.

DETAILED DESCRIPTION OF THE INVENTION

The method of the present invention has particular applicability and provides advantages in the context of gold plating zinc or polycarbonate parts to be used as hardware or decorative items on caskets. Among the advantages of the present invention are consistent color coatings, which is essential for casket hardware, and excellent adherence of the gold plating to the substrate part. It should be appreciated, however, that the specific references to zinc and polycarbonate substrates are not intended to be limiting, but rather are merely exemplary of the metal and plastic substrates that can be used in the present invention.

The details of the present invention are exemplified by the following description of preferred embodiments thereof. In a first step, a zinc substrate part is subjected to a three-stage washing or precleaning operation. The first stage is spray washing the part, and particularly the surfaces thereof to be plated, with an iron phosphatizer. A suitable product for this purpose is Secure Spray Iron Phosphatizer, available from Diversey Corp., a division of DuBois Chemical. The phosphatizer may be mixed with an additive such as DK Solvent Cleaning Additive available from Diversey Corp. Thereafter, the part is rinsed with clear water and a heavy duty rinse additive such as DU-DRI, available from DuBois Chemical, is applied to the part to aid in cleaning greases and lubricants from the zinc substrate which tend to remain on the surfaces after the parts are formed. Subsequent to the three stage precleaning step, the part is oven dried for about 8–10 minutes at a temperature of about 300–310° F.

As an aid in the adherence of the gold to the substrate, a solvent-based paint base coat is applied to the substrate via an electrostatic disc application process. A preferred base coat paint is No. 3001B available from Color Coatings Corp. of Lombard, Ill. The base coat is applied via electrostatic disc application, which is a well known method for applying paints. It has been found that applying the base coat wherein the electrostatic disc is rotating at a rate of 5500–8000 rpm, the part is rotated in the range of 40–45 hertz, and wherein the paint pressure is about 8–12 psi, results in an excellent paint coating. The paint base coat is then cured in an oven at about 265–275° F. for about 40–42 minutes.

Subsequent to curing of the paint base coat, the gold plating is performed. The gold plating operation is accomplished utilizing vacuum metallization. In this regard, it has been found particularly suitable for plating 24 K gold to place a 24 K gold wire having a diameter 0.08" in a vacuum metallizing chamber held in place with tungsten filaments such as BA9-125 filaments available from Midwest Tungsten. The part to be coated is typically held in the chamber under vacuum on the order of $3.5 \times 10^4$ torr for approximately 20–30 minutes. The final thickness of the gold plating is targeted to be in the range of 4,000–5,000 angstroms.

Once the plating step is complete, a clear paint top coat is applied over the gold plating. The top coat is preferably solvent-based paint No. 3117-3 available from Color Coatings Corp. The top coat is applied via electrostatic disc application wherein the disc is rotated at 5500–8000 rpm, the part is rotated at 40–45 hertz, and the paint is applied at a pressure of about 10½–15 psi. Lastly, the top coat is cured in an infrared oven at a temperature of about 110–130° F. for 5–7 minutes. The resulting gold plated parts exhibit excellent color consistency and adhesion.

In an alternative embodiment, the present invention is also applicable to gold plating polycarbonate or other plastic substrates. When the process is being applied to plastic substrates, the initial precleaning steps described above with respect to a zinc part are not performed. Instead, the plastic part is cleaned with deionized water and then a salt solution of 0.5%–2.0% concentration is applied to the part to impart an electrostatic charge to the plastic. Subsequent to these preliminary steps, the processing steps described hereinabove, including application of the paint base coat, the gold plating, and application of the clear paint top coat are performed as described to achieve the resulting gold plated plastic (e.g., polycarbonate) part.

While the method of the present invention has been described in detail herein with respect to specific embodiments and parameters, the invention is not intended to be limited to the specific details disclosed, but rather is defined by and is commensurate in scope with the appended claims.

What is claimed is:

1. A method of plating a plastic substrate with gold, comprising the steps of:

applying a paint base coat to at least one precleaned, electrostatically charged surface of a plastic substrate;

curing said paint base coat;

plating gold onto said paint base coat by vacuum metallization to form a gold plating;

applying a paint topcoat over said gold plating; and curing said paint topcoat.

2. The method of claim 1 wherein said paint base coat is applied electrostatically.

3. The method of claim 1 wherein said paint base coat is cured at a temperature in the range of about 265–275° F. for a duration of about 40–42 mm.

4. The method of claim 1 wherein said paint topcoat is applied electrostatically.

5. The method of claim 1 wherein said paint topcoat is cured at a temperature in the range of about 110–130° F. for a duration of about 5–7 min.

6. The method of claim 1 further comprising:

washing said at least one surface of said plastic substrate with deionized water prior to said paint base coat application step.

7. The method of claim 6 further comprising:

drying said plastic substrate subsequent to said washing at a temperature in the range of about 300–310° F. for about 8–10 min.

8. The method of claim 6 further comprising:

applying a salt solution to said at least one surface of said plastic substrate to impart an electrostatic charge thereto.

9. The method of claim 8 wherein said salt solution has a concentration of 0.5%–2.0%.

10. The method of claim 6 further comprising:

imparting an electrostatic charge to said at least one surface of said plastic substrate by incorporating carbon particles in said plastic substrate.

11. The method of claim 1 wherein said gold is 24 K gold.

12. The method of claim 1 wherein said plastic is polycarbonate.

13. A method of plating a polycarbonate substrate with 24 K gold, comprising the steps of:

washing at least one surface of said polycarbonate substrate with deionized water;

applying a salt solution to said at least one surface to impart an electrostatic charge thereto;

applying a paint base coat to said washed surface of said polycarbonate substrate;

curing said paint base coat;

plating 24 K gold onto said paint base coat by vacuum metallization to form a gold plating;

applying a paint topcoat over said gold plating; and curing said paint topcoat.

* * * * *

UNITED STATES PATENT AND TRADEMARK OFFICE
CERTIFICATE OF CORRECTION

PATENT NO. : 5,976,634
DATED : November 2, 1999
INVENTOR(S) : James W. tanner et al.

It is certified that error appears in the above-indentified patent and that said Letters Patent is hereby corrected as shown below:

At column 4, line 7, please replace "mm" with --min--.

Signed and Sealed this

Third Day of April, 2001

Attest:

NICHOLAS P. GODICI

Attesting Officer     Acting Director of the United States Patent and Trademark Office